(12) United States Patent
Sugimoto et al.

(10) Patent No.: US 9,496,465 B2
(45) Date of Patent: Nov. 15, 2016

(54) LIGHT EMITTING DEVICE

(71) Applicants: NICHIA CORPORATION, Anan-shi, Tokushima (JP); KOITO MANUFACTURING CO., LTD., Minato-ku, Tokyo (JP)

(72) Inventors: Kunihito Sugimoto, Anan (JP); Keisuke Sejiki, Tokushima (JP); Tsukasa Tokida, Shizuoka (JP); Shinpei Maeda, Shizuoka (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/785,027

(22) PCT Filed: Mar. 26, 2014

(86) PCT No.: PCT/JP2014/058530
§ 371 (c)(1),
(2) Date: Oct. 16, 2015

(87) PCT Pub. No.: WO2014/171277
PCT Pub. Date: Oct. 23, 2014

(65) Prior Publication Data
US 2016/0079486 A1 Mar. 17, 2016

(30) Foreign Application Priority Data
Apr. 17, 2013 (JP) ................ 2013-086357

(51) Int. Cl.
*H01L 29/18* (2006.01)
*H01L 33/50* (2010.01)
*H01L 25/075* (2006.01)
(Continued)

(52) U.S. Cl.
CPC ......... *H01L 33/505* (2013.01); *H01L 25/0753* (2013.01); *H01L 33/502* (2013.01); *H01L 33/56* (2013.01); *H01L 33/60* (2013.01); *H01L 2224/16225* (2013.01); *H01L 2924/0002* (2013.01)

(58) Field of Classification Search
CPC .... H01L 33/505; H01L 33/502; H01L 33/60
USPC ......................................... 257/88
See application file for complete search history.

(56) References Cited

U.S. PATENT DOCUMENTS

2004/0041220 A1    3/2004   Kwak et al.
2010/0264438 A1   10/2010   Suenaga
2011/0235355 A1    9/2011   Seko
(Continued)

FOREIGN PATENT DOCUMENTS

JP    2004-096113 A    3/2004
JP    2010-192629 A    9/2010
(Continued)

*Primary Examiner* — Anthony Ho
(74) *Attorney, Agent, or Firm* — Global IP Counselors, LLP

(57) ABSTRACT

A light emitting device includes a light emitting element whose upper surface is a light extraction surface, and a light-transmissive member that has an upper surface and a lower surface, and covers the light extraction surface of the light emitting element. The light-transmissive member contains a phosphor. The upper surface and the lower surface of the light-transmissive member are both flat surfaces and parallel to each other. A side surface of the light-transmissive member has a protruding portion that protrudes to the side and has contact with the lower surface.

7 Claims, 4 Drawing Sheets

(51) Int. Cl.
*H01L 33/56* (2010.01)
*H01L 33/60* (2010.01)

(56) References Cited

U.S. PATENT DOCUMENTS

| | | |
|---|---|---|
| 2011/0272706 A1 | 11/2011 | Kwak et al. |
| 2012/0223326 A1 | 9/2012 | Kwak et al. |
| 2013/0056781 A1 | 3/2013 | Suenaga |
| 2013/0127331 A1 | 5/2013 | Tsutsumi et al. |
| 2013/0313602 A1 | 11/2013 | Suenaga |
| 2015/0125979 A1 | 5/2015 | Kwak et al. |

FOREIGN PATENT DOCUMENTS

| | | |
|---|---|---|
| JP | 2010-272847 A | 12/2010 |
| JP | 2011-204376 A | 10/2011 |
| JP | 2012-038889 A | 2/2012 |
| JP | 2012-079776 A | 4/2012 |

LIGHT EMITTING DEVICE

TECHNICAL FIELD

The present invention relates to a light emitting device with a light-transmissive member that is capable of transmitting light from a light emitting element.

BACKGROUND ART

In recent years semiconductor light emitting elements have been used not only as illumination-use light sources as alternatives to fluorescent lights, but also as light sources having good directivity and high luminance, such as in automotive headlights and other such floodlights, floodlighting and the like.

A light emitting device for such use has been proposed in JP2010-272847A. In this light emitting device, in order to make higher luminance possible, the outer peripheral side surface of a light-transmissive member which covers and is joined to the light emitting element is a sloped surface that spreads out toward the lower surface, and of this lower surface, the sloped surface and a portion of this lower surface which is not joined to the light emitting element are covered with a light reflecting resin.

SUMMARY OF INVENTION

However, in developing light emitting devices, there is a particular need for devices that can be made more compact and have little color unevenness, particularly in vehicular application.

The present invention was conceived in light of the above problem, and it is an object thereof to provide a light emitting device that can be made smaller and that has less color unevenness.

A light emitting device of the present invention includes: a light emitting element whose upper surface is a light extraction surface, and a light-transmissive member that has an upper surface and a lower surface, and covers the light extraction surface of the light emitting element, the light-transmissive member contains a phosphor, the upper surface and the lower surface of the light-transmissive member are both flat surfaces and parallel to each other, a side surface of the light-transmissive member has a protruding portion that protrudes to a side and contacts the lower surface.

The light emitting device of the present invention, it is possible to realize further miniaturization. The light emitting device with uniform front luminance and less color unevenness can be provided.

DESCRIPTION OF EMBODIMENTS

Figure 1A:
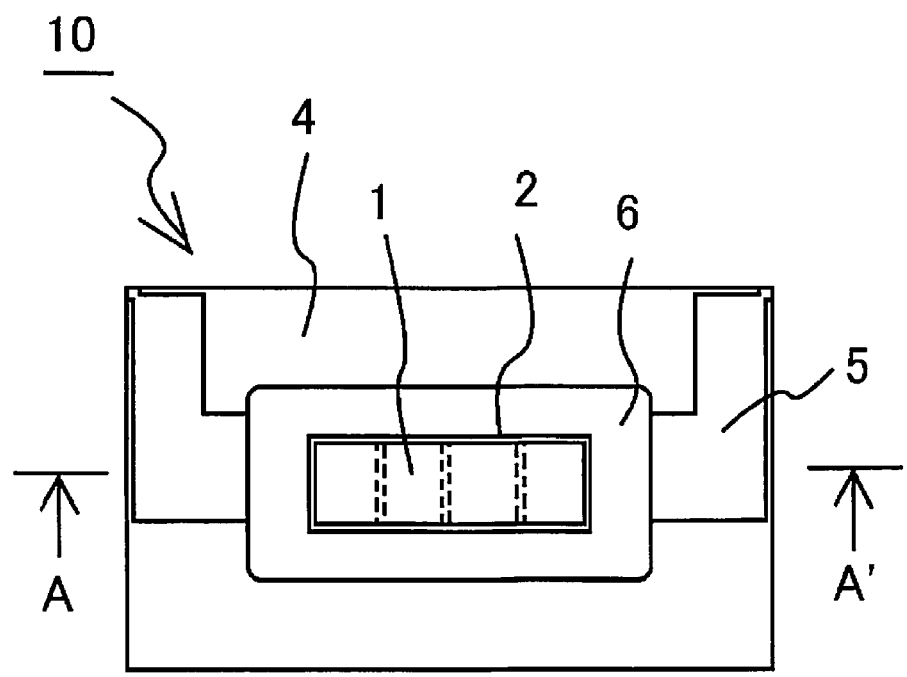
FIG. 1A is a simplified plan view of the light emitting device in Embodiment 1 of the present invention.

The sizes and the arrangement relationships of the members in each of drawings are occasionally shown exaggerated for ease of explanation. In the description below, the same designations or the same reference numerals may, in principle, denote the same or like members and duplicative descriptions will be appropriately omitted. Further, constitutions described in some of examples and embodiments can be employed in other examples and embodiments.

Figure 1B:
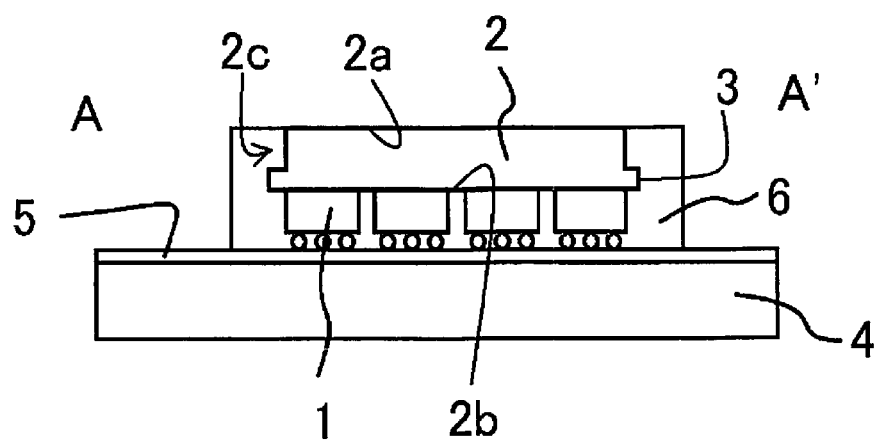
FIG. 1B is a cross section along the A-A' line in FIG. 1A.

As shown in the plan view of FIG. 1A and the cross section of FIG. 1B, a light emitting device 10 comprises light emitting elements 1 whose upper surfaces serve as light extraction surfaces, and a light-transmissive member 2 that has an upper surface and a lower surface and covers the light extraction surfaces of the light emitting elements 1.

Light Emitting Elements 1

As a light emitting element, a light emitting diode is usually used.

The composition, emission color or wavelength, size, number and the like of the light emitting element can be selected in accordance with the intended use. For example, examples as a blue- or green-light emitting element include a light emitting element which uses a semiconductor layer such as ZnSe, a nitride-based semiconductor material $(In_XAl_YGa_{1-X-Y}N$ ($0 \leq X$, $0 \leq Y$, $X+Y \leq 1$) and GaP; and a red-light emitting element include a light emitting element which uses a semiconductor layer such as GaAlAs, AlInGaP.

The light emitting element is usually formed by stacking a semiconductor layer over a light-transmissive growth substrate (such as a sapphire substrate). The substrate becomes the upper surface side of the light emitting element, and serves as the light extraction surface. The substrate may have texturing on the joint surface with the semiconductor layer. This allows intentionally varying the critical angle when the light strikes the substrate, so that the light emitted from the semiconductor layer can be easily extracted to the outside of the substrate.

With the light emitting element, the growth substrate may be removed after stacking the semiconductor layer. This removal can be accomplished, for example, by polishing, LLO (laser lift-off), or the like. In the case where the growth substrate is removed, the semiconductor layer closest to the substrate becomes the upper surface side, and serves as the light extraction surface.

The light emitting elements preferably have a pair of positive and negative electrodes on the same side. This allows the light emitting elements to be flip-chip mounted to the mounting substrate. In this case, the surface that is opposite the surface on which the pair of electrodes is formed becomes the light extraction surface.

A single light emitting device may include one or more light emitting elements. In other words, one or more light emitting elements may be covered by a single light-transmissive member.

Light-Transmissive Member

The light-transmissive member covers the light extraction surface of the light emitting element, and allows for transmitting light emitted from the light emitting element to extract outside. The light-transmissive member contains a phosphor.

The light-transmissive member has an upper surface and a lower surface. The lower surface covers the light extraction surface of the light emitting element, and the upper surface serves as the surface that emits a light from the light emitting element. Usually, in order to extract all of a light emitted from the light emitting elements, it may be necessary for the light-transmissive member to cover the entire light extraction surface of the light emitting element. On the other hand, it has been confirmed that the more the light-transmissive member is larger than the light extraction surface, the greater is the decrease in luminance of extracted light. Therefore, the upper surface of the light-transmissive member that covers the light emitting element is equal to or larger than the light extraction surfaces of the light emitting elements, but is preferably to have a similar size to the size of the light extraction surface as long as possible. That is, the edge of the upper surface of the light-transmissive member preferably coincides with the outer edge of the light emitting element in plan view. This not only makes it possible for the light emitting device to be even smaller, but also affords higher luminance.

In the case where a plurality of light emitting elements are covered by a single light-transmissive member, the entire light extraction surfaces of the plurality of light emitting elements will need to be covered by the light-transmissive member. Also, the edges of the upper surface of the light-transmissive member here preferably coincide with the outer edges of a group of the light emitting elements disposed on the substrate in plan view.

The upper surface and lower surface of the light-transmissive member are preferably both flat surfaces and parallel to each other. The term parallel here encompasses a situation in which one of the upper and lower surfaces is permitted to be sloped by about ±5° to the other one. A shape such as this allows to achieve a light emitting device with little color unevenness and uniform front luminance on the upper surface of the light-transmissive member that serves as the emission surface.

There are no particular restrictions on the thickness of the light-transmissive member, and it can be about 50 to 300 µm, for example.

Figure 2A:
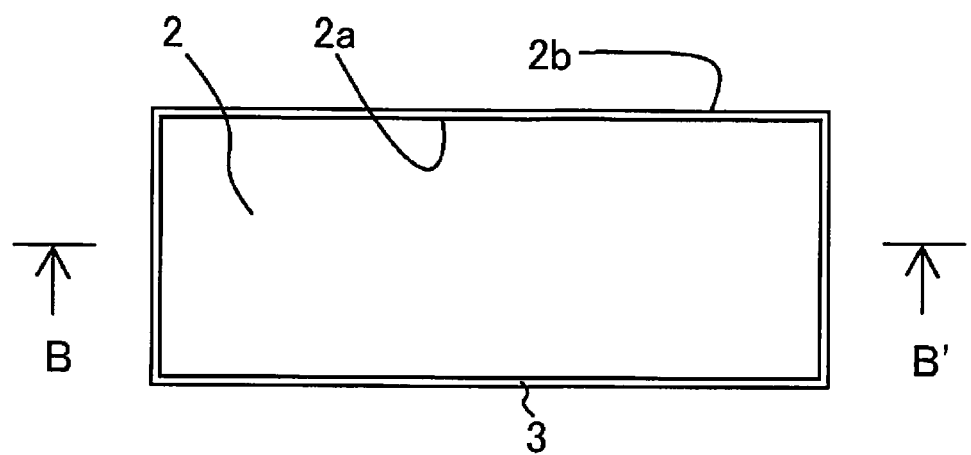
FIG. 2A is a simplified plan view of the light-transmissive member used in the light emitting device in Embodiment 1 of the present invention.
Figure 2B:
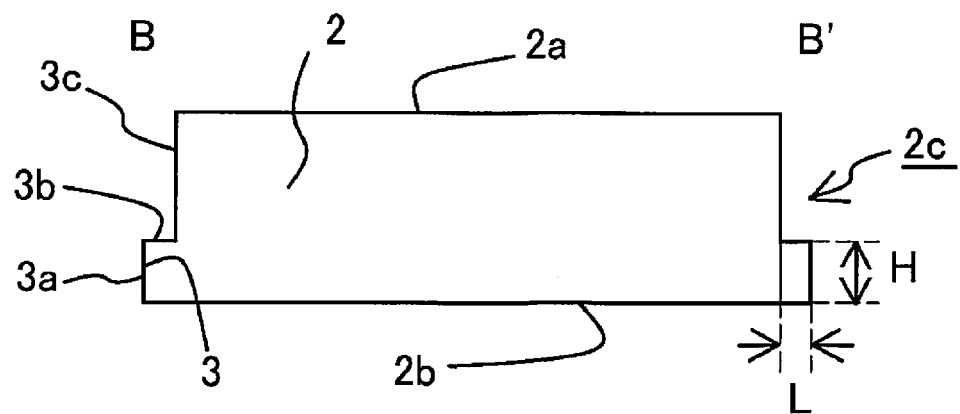
FIG. 2B is a cross section along the A-A' line in FIG. 2A.

As shown in FIGS. 2A and 2B, the light-transmissive member 2 has a protruding portion 3 that protrudes to a side and contacts with the lower surface 2b, on the side surface 2c. The phrase "contact with the lower surface 2b" here means that a part of the surface constituting the lower surface 2b of the light-transmissive member 2 becomes a part of the surface constituting the protruding portion 3. In other words, it means that a surface extending from the lower surface 2b of the light-transmissive member 2 becomes part of the surface constituting the protruding portion 3 so as to constitute the same plane as that of the lower surface 2b of the light-transmissive member 2.

The protruding portion 3 of the light-transmissive member 2 has not only the lower surface 2b of the light-transmissive member 2, but also a vertical surface 3a that touches the lower surface 2b, and a surface 3b that touches this vertical surface 3a and is parallel to the upper surface 2a of the light-transmissive member 2. The protruding portion 3 preferably further have a second vertical surface 3c that touches on the supper surface 2a and the surface 3b parallel to the upper surface 2a of the light-transmissive member 2.

Alternatively, in case where the upper surface of the light-transmissive member 2 is textured, curved, or lens-shaped, the surface that touches the vertical surface 3a and the second vertical surface 3c is preferably parallel to the light extraction surface of the light emitting element or the lower surface of the light-transmissive member 2.

The vertical surfaces 3a, second vertical surfaces 3c, and parallel surfaces 3b at the side surfaces 2c of the light-transmissive member 2 are preferably smooth, flat surfaces that are not sloped or curved. This affords uniform thickness of a light reflecting member disposed at the upper part of the side protruding portion (on the surface 3b). Therefore, a light emitting device with a sharp difference in luminance between the emitting part (the light-transmissive member upper surface (2a)) and the non-emitting part (the white resin surrounding the light-transmissive member (on 3b)), and little color unevenness can be obtained.

A length L (see FIG. 2B) of the protruding portion 3 that protrudes to the side is about 10 to 300 µm, for example. The greater is this length, the entire upper surfaces of the light emitting elements can be covered by the lower surface of the light-transmissive member, even when there is some positional shifting, in the covering of the light emitting elements by the light-transmissive member, as will be discussed below. However, the greater is this length, the greater is the proportion that will be disposed other than the upper surfaces of the light emitting elements, which may lead to color unevenness, when this length is too great.

A height H (see FIG. 2B) of the protruding portion from the lower surface 2b of the light-transmissive member 2 is preferably about 25% of the thickness of the light-transmissive member, for example. The greater is the thickness, the smaller is the amount of a light reflecting member disposed above the protruding portion, which may lead to color unevenness. Also, the less is the thickness, the more likely it is that chipping and the like will occur, and light from the light emitting elements will be less likely to propagate to the upper surface.

Thus, in the case where the light-transmissive member has the protruding portion, enough surface area can be ensured on the lower surface side to be able to receive all of the light emitted from the light emitting elements.

In addition, on the upper surface side, that is, the light extraction surface side of the light-transmissive member, the received light can be emitted from a planar surface area similar to that of the light emitting elements. As a result, luminance can be increased.

At the light extraction face of the light-transmissive member, since the leakage of light around the light emitting part can be reduced, it is possible to provide a light emitting device with good visibility. The term good visibility here means that the boundary between the light emitting portion and the non-light emitting portion is clear, as the luminance difference between the light emitting portion and the non-light emitting portion is steeper, sharpness or visibility property is improved.

The surface area of the lower surface of the light-transmissive member is larger than the surface area of the upper surfaces of the light emitting elements. Consequently, the entire light emission surfaces of the light emitting elements can be covered with the light-transmissive member, so light loss can be reduced. Also, even if some positional shifting occurs in the disposing of the light-transmissive member above the light emitting elements, since the entire upper surfaces of the light emitting elements can be covered with the lower surface of the light-transmissive member, this shifting will cause almost no change in luminance. As a result, the yield can be higher in a manufacture of the light emitting devices. Also, as will be discussed below, in the case where an adhesive agent is used to join the light emitting elements and the light-transmissive member, leakage or creep of the adhesive to the side surfaces of the light-transmissive member can be prevented. An adhesive agent will absorb or scatter light from the light emitting elements, so that a light from the light emitting elements is efficiently reflected by the light reflecting member discussed below. Thus, preferably no adhesive material or other such joining member is provided anywhere but at the joining surfaces.

The term "surface area" here means the planar surface area of the lower surface of the light-transmissive member and the upper surfaces of the light emitting elements in the case where they are flat surfaces, and in the case where they are not flat surfaces, it means the surface area within the outer edges of the upper surfaces of the light emitting elements and the lower surface of the light-transmissive member.

The ration of the surface area of the lower surface of the light-transmissive member to the surface area of the upper surfaces of the light emitting elements is preferably about 10:8 to 10:10, with about 10:9 to 10:10 being more preferable, and about 10:9 to 10:9.5 being even more preferable.

The surface area of the upper surface of the light-transmissive member is preferably the same as the surface area of the upper surfaces of the light emitting element. The term "the same" here means that a difference of about ±10% is permitted.

There are no particular restrictions on the material of the light-transmissive member, so long as it contains a phosphor, and examples include resin, glass, and inorganic substances. The material may also be cut from a phosphor ingot such as single crystals or polycrystals of a phosphor, or a sinter of a phosphor powder, or may be a sintered mixture of a phosphor powder with a resin, glass, an inorganic substance, or the like. The higher the transparency, the more readily will light be reflected at the interface with the light reflecting member discussed below, so that the luminance can be increased.

Examples of phosphors that emit white light when combined with a blue light emitting element include YAG-based materials and BOS-based materials. In the case where a phosphor such as this is contained in the light-transmissive member, the concentration of the phosphor is preferably about 5 to 50%, for example.

The light-transmissive member is joined so as to cover the light extraction surfaces of the light emitting elements. This joining can be accomplished by compression bonding, sintering, adhering with a known adhesive such as an epoxy or silicone, bonding with an organic adhesive having a high refractive index, bonding with low-melting point glass, etc.

For example, in the case where the light-transmissive member contains a phosphor that emits white light when combined with a blue light emitting element, by containing a red phosphor in the adhesive agent that joins the blue light emitting element to the light-transmissive member, a light emitting device can be obtained that emits light bulb color according to JIS standards.

The protruding portion of the light-transmissive member can be formed in the above-mentioned shape by suitably selecting the blade width and blade tip angle of the dicing blade when the light-transmissive member is diced into individual pieces. They can also be formed by performing half-dicing as the dicing method.

Light Reflecting Member

As shown in FIGS. 1A and 1B, the light emitting device may comprise a light reflecting member 6 that surrounds the light emitting elements 1 and/or the light-transmissive member 2. It is especially preferable in case that the light reflecting member 6 surrounds both the light emitting elements 1 and the light-transmissive member 2. However, in the case where the light reflecting member 6 surrounds the light-transmissive member 2, the upper surface 2a of the light-transmissive member 2 is not covered by the light reflecting member 6, and it is preferable that the upper surface 2a of the light-transmissive member 2 and the light reflecting member 6 are on a same plane, or to protrude from the upper surface of the light reflecting member 6.

In general, light emitted from the upper surface of the light-transmissive member that serves as the emission surface also spreads out in the lateral direction. In the case where the upper surface of the light reflecting member protrudes from the upper surface of the light-transmissive member (that is, in the case where it is higher than the upper surface of the light-transmissive member), the light emitted from the upper surface of the light-transmissive member will apply the light reflecting member and be reflected, resulting in unevenness in the light distribution. Thus, emitted light can be extracted directly to the outside by covering the side surfaces of the light-transmissive member with the light reflecting member, while lowering the height of the light reflecting member that covers an outer periphery of these side surfaces.

Also, when the light-transmissive member is separated, there may be a change in the distribution of the phosphor located between the light emitting elements and the emission surface, resulting in color unevenness. On the other hand, in the case where the light-transmissive member is surrounded by a light reflecting member, and the light-transmissive member is held by this, there will be no separation, shifting, or the like of the light-transmissive member, so there is no risk of color unevenness and the like.

The light reflecting member is formed from a material capable of reflecting the light emitted from the light emitting elements. With this configuration, a light emitted from the light emitting elements is reflected within the light emitting elements or the light-transmissive member at the boundary between the light reflecting member and the light emitting elements or the light-transmissive member. As a result, the light propagates within the light emitting elements or the light-transmissive member, and is finally emitted to the outside from the upper surface of the light-transmissive member.

The light reflecting member can be formed from a resin including at least one of a silicone resin, a modified silicone resin, an epoxy resin, a modified epoxy resin, an acrylic resin or a hybrid resin containing one or more of those resins, and a reflecting substance. Examples of the reflecting substance include titanium oxide, silicon oxide, zirconium oxide, potassium titanate, alumina, aluminum nitride, boron nitride, mullite and the like.

The light reflecting member may be made from a material that not only is reflective, but also dissipates heat. Examples of such a material include boron nitride and aluminum nitride with high thermal conductivity. The thermal conductivity of the light reflecting member is preferably at least 1 W/m·K, and more preferably at least 3 W/m·K. Thus setting the thermal conductivity high allows the contact surface area between the light-transmissive member and the light reflecting member to be increased, in conjunction with the shape of the above-mentioned protruding portion on the side surfaces of the light-transmissive member. As a result, heat that accumulates in the light-transmissive member will be readily transmitted to the light reflecting member, which can improve the heat dissipation of the light-transmissive member. The phosphor contained in the light-transmissive member may sometimes self-heats attributable to Stokes loss, and this heat may lower the light conversion efficiency. However, setting the thermal conductivity of the light reflecting member to be high as discussed above, the heat of the phosphor in the light-transmissive member can be efficiently released.

The amount of reflected light, the amount of transmitted light and the like can be varied by according to the amount and/or the thickness of reflective substance, etc. Thus, the characteristics, etc., of the light emitting device to be obtained can be adjusted as desired. For instance, it is preferable for the amount in which the reflective substance is contained to be at least 30 wt %, and for its thickness to be at least 20 µm.

The light reflecting member can be formed by using injection molding method, potting molding method, resin printing method, transfer molding method or compression molding method.

A Zener diode or other such protective element may be mounted in the light emitting device of the present invention. The protective element can be embedded in the light reflecting member 6 to prevent a decrease in light extraction due to the absorption of a light from the light emitting elements by the protective element or blocking of light ed by the protective element.

Substrate

As shown in FIGS. 1A and 1B, the light emitting elements 1 of the light emitting device are usually placed on a substrate 4. Examples of the material of the substrate include glass epoxy, resin, ceramic, or another such insulating member, and a metal member on which an insulating member has been formed. It is especially preferable to use a ceramic with high weather resistance and high heat resistance. Examples of ceramic materials include alumina, aluminum nitride, and mullite. These ceramic materials may be combined with BT resin, glass epoxy, an epoxy resin, or another such insulating material, for example.

The substrate 4 is usually one having on its surface a wiring 5 that is connected to the light emitting elements 1. Such a substrate is known in this field, and any substrate that is used for the mounting of light emitting elements and the like can be used.

Luminance Evaluation

Using the light-transmissive member 2 shown in FIGS. 2A and 2B, the light emitting device 10 shown in FIGS. 1A and 1B was produced and its luminance distribution was measured.

In this light emitting device 10, four light emitting elements 1 (measuring 1.3×1.3 mm) are arranged in series on the substrate 4. The substrate is produced by vapor depositing a pattern of titanium, palladium, and gold in that order on the surface of an aluminum nitride board material having a thermal conductivity of about 170 W/m·K, and then plating with gold over this. The light emitting elements is flip-chip mounted with bumps made of gold.

The upper surfaces of the light emitting elements 1 is covered by a board-shaped light-transmissive member 2 (containing 5 to 10 wt % YAG phosphor, and measuring 1.55×5.9×0.20 mm (thickness) that was formed by mixing and sintering YAG and alumina. This covering is performed by heat-curing an adhesive agent made of a silicone resin.

A length L of the protruding portion 3 of the light-transmissive member 2 was 0.125 mm, and the height H was 0.05 mm.

The side surfaces of the light-transmissive member 2 and the light emitting elements 1 is surrounded by the light reflecting member 6 by potting. The light reflecting member 6 consisted of a silicone resin that contained 30 wt % titanium oxide, and its thermal conductivity is about 1 W/m·K.

The light reflecting member 6 is substantially on a same plane with the upper surface 2a of the light-transmissive member 2, and the thickness of the side surfaces of the light emitting elements 1 and the light-transmissive member 2 is about 1.2 mm.

Figure 4A:
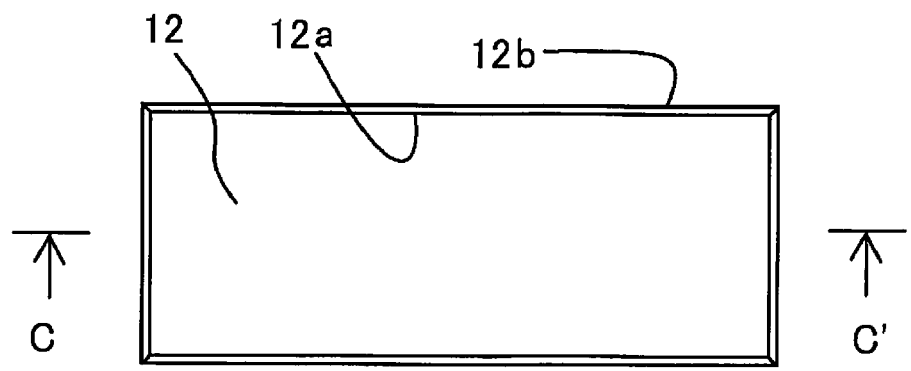
FIG. 4A is a simplified plan view of the light-transmissive member used in a comparative light emitting device.
Figure 4B:
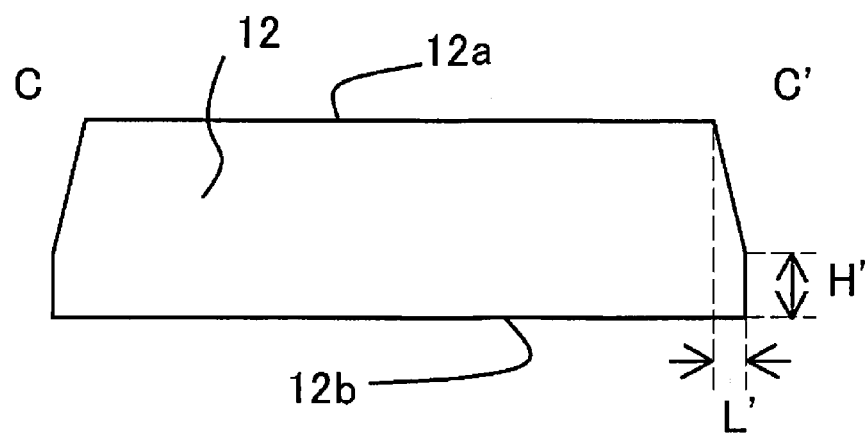
FIG. 4B is a cross section along the C-C' line in FIG. 4A.

Also, for the sake of comparison, a similar light emitting device was produced using the light-transmissive member 12 shown in FIGS. 4A and 4B, and the luminance distribution was measured.

In this light-transmissive member 12, the size and thickness of the upper and lower surfaces, as well as the material, are the same as those of the light-transmissive member 2 discussed above, but the side surfaces thereof have a sloped surface that is sloped at 45° on the upper surface side, and on the lower surface side have a vertical surface that protrudes by a length L' (0.125 mm) beyond the upper surface and has a height H' (0.075 mm).

A ProMetric (PM-1423F-1) was used to measure the luminance distribution, and a relative comparison was made. The luminance distribution was measured at the front surfaces of the light emitting devices produced using the light-transmissive members 2 and 12, and cross sectional data (FIGS. 3A and 3B) were produced from the luminance distribution at the front surfaces.

Figure 3A:
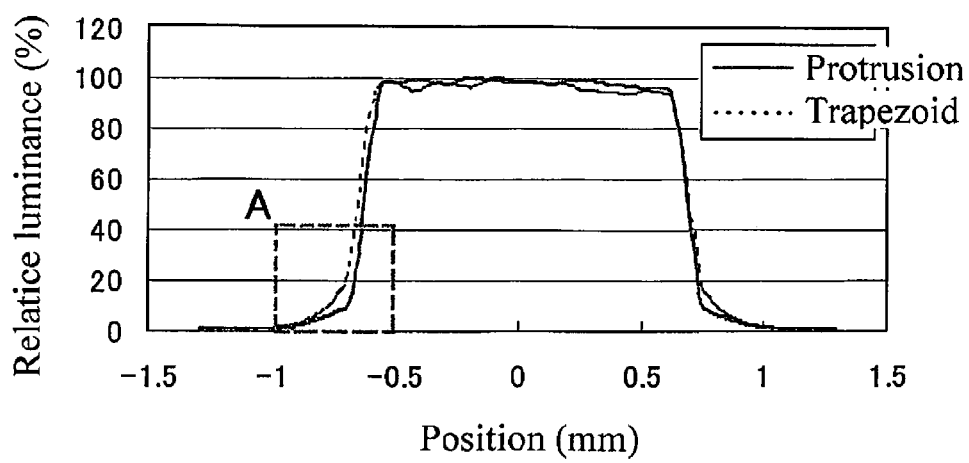
FIG. 3A is a graph of cross sectional data for luminance of the light emitting device in Embodiment 1 of the present invention.
Figure 3B:
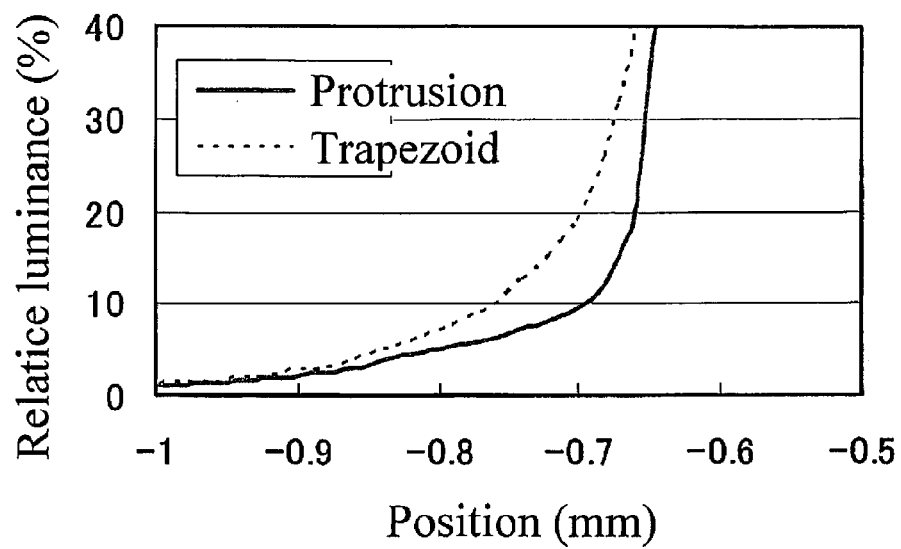
FIG. 3B is a detail view of the A portion in FIG. 3A.

As a result, as shown in FIGS. 3A and 3B, with the light emitting device in this embodiment comprising protruding portion on the light-transmissive member, there was a sharper difference in luminance between a light emitting part and a non-emitting part, and a light emitting device with good visibility can be provided.

The leakage of light from places other than the light emitting part may cause that an unnecessary light illuminates an unnecessary portion, and may also be linked to being a cause of glare when the light emitting device is assembled into a headlamp or the like, for example. When the luminance at the front surface of the light emitting device is taken into account, it is important that there be a clearly defined boundary between the light emitting part and the non-emitting part (good visibility).

The light emitting device of the present invention can be used for various light sources such as an illumination light source, various indicators light sources, automotive light sources, a display light source, a liquid crystal backlight light source, traffic signal, vehicle parts, billboards channel letters and the like.

The invention claimed is:
1. A light emitting device comprising:
a plurality of light emitting elements that each have an upper surface as a light extraction surface;
a light reflecting member that surrounds the light emitting elements; and
a light-transmissive member that has an upper surface and a lower surface which are both flat surfaces and parallel to each other, covers the light extraction surface of each of the light emitting elements and part of the light reflecting member disposed between the light emitting elements, contains a phosphor, and includes a protrud- ing portion protruding to a side and being aligned with the lower surface, on a side surface, the protruding portion of the light-transmissive member having
- a vertical surface that touches the lower surface of the protruding portion, and
- a surface that touches the vertical surface and is parallel to the upper surface of the light-transmissive member.

2. The light emitting device according to claim 1, wherein the light reflecting member surrounds the light-transmissive member.

3. The light emitting device according to claim 1, wherein the protruding portion of the light-transmissive member further has
- a lower surface that is part of the surface constituting the lower surface of the light-transmissive member, and contacts the vertical surface.

4. The light emitting device according to claim 1, wherein the upper surface of the light-transmissive member is on a same plane with the light reflecting member, or protrudes from an upper surface of the light reflecting member.

5. The light emitting device according to claim 1, wherein an edge of the upper surface of the light-transmissive member coincides with the outer edge of the light emitting element in plan view.

6. The light emitting device according to claim 1, wherein the side surface of the light-transmissive member further has a second vertical surface that contacts the protruding portion.

7. The light emitting device according to claim 1, wherein the upper surface of the light-transmissive member is entirely flat.

* * * * *